US012772418B2

(12) United States Patent
Yin

(10) Patent No.: US 12,772,418 B2
(45) Date of Patent: Oct. 20, 2026

(54) HEAT DISSIPATION APPARATUS AND VEHICLE

(71) Applicant: Yinwang Intelligent Technologies Co., Ltd., Shenzhen (CN)

(72) Inventor: Jianqiang Yin, Dongguan (CN)

(73) Assignee: YINWANG INTELLIGENT TECHNOLOGIES CO., LTD., Shenzhen (CN)

( * ) Notice: Subject to any disclaimer, the term of this patent is extended or adjusted under 35 U.S.C. 154(b) by 187 days.

(21) Appl. No.: 18/322,001

(22) Filed: May 23, 2023

(65) Prior Publication Data

US 2023/0301028 A1 Sep. 21, 2023

Related U.S. Application Data

(63) Continuation of application No. PCT/CN2021/095067, filed on May 21, 2021.

(30) Foreign Application Priority Data

Nov. 24, 2020 (CN) ......................... 202011327980.8

(51) Int. Cl.

| | |
|---|---|
| ***H05K 7/20*** | (2006.01) |
| ***B60R 16/02*** | (2006.01) |
| *B60W 60/00* | (2020.01) |

(52) U.S. Cl.

CPC ..... *H05K 7/20409* (2013.01); *H05K 7/20163* (2013.01); *H05K 7/20254* (2013.01);

(Continued)

(58) Field of Classification Search

CPC ............. H05K 7/20163; H05K 7/2039; H05K 7/20409; H05K 7/20254; H05K 7/20263;

(Continued)

(56) References Cited

U.S. PATENT DOCUMENTS

H239 H * 3/1987 Franklin ................. F24D 3/142 165/47
5,144,531 A * 9/1992 Go ........................ H01L 23/473 257/E23.098

(Continued)

FOREIGN PATENT DOCUMENTS

CN 101166409 A 4/2008
CN 105658033 A 6/2016

(Continued)

*Primary Examiner* — Robert J Hoffberg
(74) *Attorney, Agent, or Firm* — Conley Rose, P.C.

(57) ABSTRACT

A heat dissipation apparatus includes a liquid storage tank, a liquid pump, a first heat exchanger, a second heat exchanger and a heat dissipation fan. The liquid storage tank stores liquid coolant. The liquid pump extracts the liquid coolant from the liquid storage tank, and pressurizes the liquid coolant to enable the liquid coolant to circulate sequentially along the liquid storage tank, the first heat exchanger, and the second heat exchanger. The first heat exchanger is in contact with a heat source, absorbs heat from the heat source, and transfers the heat to the liquid coolant. The heat dissipation fan generates cooling air for the second heat exchanger to accelerate air flow around the second heat exchanger. The second heat exchanger absorbs heat from the liquid coolant, and volatilizes the heat into air.

20 Claims, 9 Drawing Sheets

(52) U.S. Cl.
CPC ..... *H05K 7/20263* (2013.01); *H05K 7/20272* (2013.01); *H05K 7/20863* (2013.01); *H05K 7/20872* (2013.01); *B60R 16/02* (2013.01); *B60W 60/00* (2020.02)

(58) Field of Classification Search
CPC ........... H05K 7/20272; H05K 7/20863; H05K 7/20972; B60R 16/02; B60W 60/00; F16L 37/38
See application file for complete search history.

(56) References Cited

U.S. PATENT DOCUMENTS

| | | | | | |
|---|---|---|---|---|---|
| 5,285,347 | A * | 2/1994 | Fox | G06F 1/20 257/714 |
| 5,323,847 | A * | 6/1994 | Koizumi | H05K 7/20645 165/200 |
| 5,401,000 | A * | 3/1995 | Tsay | F16L 37/38 251/149.6 |
| 5,829,516 | A * | 11/1998 | Lavochkin | H01L 25/117 29/890.038 |
| 6,166,907 | A * | 12/2000 | Chien | F28D 1/0478 361/689 |
| 6,634,435 | B2 * | 10/2003 | Saeger | A01M 21/02 239/289 |
| 6,747,869 | B2 * | 6/2004 | Dong | G06F 1/20 361/679.52 |
| 6,802,366 | B1 * | 10/2004 | Dillon | F28F 1/22 29/890.044 |
| 6,853,555 | B2 * | 2/2005 | Fichera | H05K 7/20927 257/E23.098 |
| 6,989,990 | B2 * | 1/2006 | Malone | G06F 1/20 361/689 |
| 7,002,799 | B2 * | 2/2006 | Malone | H05K 7/20772 174/15.1 |
| 7,149,084 | B2 * | 12/2006 | Matsushima | G06F 1/20 174/15.1 |
| 7,272,015 | B2 * | 9/2007 | Karrer | B60R 16/0239 174/15.1 |
| 7,673,389 | B2 * | 3/2010 | Lehman | H05K 7/20254 29/890.038 |
| 8,245,401 | B2 * | 8/2012 | Lehman | H05K 7/20254 29/890.035 |
| 10,136,554 | B2 * | 11/2018 | Chainer | G05D 23/1919 |
| 10,143,109 | B2 * | 11/2018 | Chainer | G05D 23/1919 |
| 10,185,375 | B2 * | 1/2019 | Franz | H05K 7/20781 |
| 10,386,896 | B2 * | 8/2019 | Li | G06F 1/20 |
| 10,834,847 | B1 | 11/2020 | Yatskov | |
| 10,849,251 | B2 * | 11/2020 | Lan | H05K 7/20772 |
| 11,025,034 | B2 * | 6/2021 | Hodges | F28F 3/12 |
| 11,324,144 | B2 * | 5/2022 | Stefanoski | G05D 1/021 |
| 2004/0008483 | A1 * | 1/2004 | Cheon | G06F 1/20 361/699 |
| 2005/0081534 | A1 | 4/2005 | Suzuki et al. | |
| 2005/0241803 | A1 * | 11/2005 | Malone | G06F 1/20 165/80.4 |
| 2006/0169440 | A1 | 8/2006 | Chou et al. | |
| 2007/0064393 | A1 * | 3/2007 | Chen | H10W 40/47 257/E23.098 |
| 2015/0047809 | A1 | 2/2015 | Arvelo et al. | |
| 2018/0062347 | A1 * | 3/2018 | Hodges | F28F 3/12 |
| 2018/0228040 | A1 * | 8/2018 | Lykke | B60R 16/0215 |
| 2019/0390097 | A1 * | 12/2019 | Oblak | C09K 5/10 |
| 2020/0001682 | A1 | 1/2020 | Lee et al. | |
| 2020/0137928 | A1 | 4/2020 | Lu et al. | |
| 2022/0071059 | A1 * | 3/2022 | Ma | H05K 7/20272 |

FOREIGN PATENT DOCUMENTS

| | | | | |
|---|---|---|---|---|
| CN | 108227351 | A | 6/2018 | |
| CN | 208128727 | U | 11/2018 | |
| CN | 109196968 | A | 1/2019 | |
| CN | 109990154 | A * | 7/2019 | F16L 37/38 |
| CN | 209879440 | U | 12/2019 | |
| CN | 211617603 | U | 10/2020 | |
| KR | 20090097557 | A | 9/2009 | |

* cited by examiner

HEAT DISSIPATION APPARATUS AND VEHICLE

CROSS-REFERENCE TO RELATED APPLICATIONS

This application is a continuation of International Patent Application No. PCT/CN2021/095067 filed on May 21, 2021, which claims priority to Chinese Patent Application No. 202011327980.8 filed on Nov. 24, 2020. The disclosures of the aforementioned applications are hereby incorporated by reference in their entireties.

TECHNICAL FIELD

This application relates to the field of electronic component heat dissipation technologies, and in particular, to a heat dissipation apparatus and a vehicle.

BACKGROUND

A control system of an autonomous vehicle, especially a control system of a high-level autonomous vehicle, usually includes an autonomous driving computing platform (or a vehicle-mounted computing module), for example, a mobile data center (MDC). The autonomous driving computing platform can sense an ambient environment through a vehicle-mounted sensor such as a camera, a laser radar, a millimeter-wave radar, or an ultrasonic wave, make a decision based on obtained information, and formulate a corresponding policy based on an appropriate working model, for example, predict motion statuses of the vehicle, another vehicle, a pedestrian, and the like in a future period of time, and plan a collision avoidance path.

The autonomous driving computing platform generates heat during running. A higher level of autonomous driving indicates higher power of the autonomous driving computing platform and higher generated heat. If no effective heat dissipation means is provided, normal running of the autonomous driving computing platform is affected due to overheating.

For a conventional fossil fuel-powered vehicle, an air-cooled heat dissipation manner is usually used for an autonomous driving computing platform. Because a front compartment of the conventional fossil fuel-powered vehicle has components such as an engine, a gearbox, and a battery, and a temperature is high, the autonomous driving computing platform is not suitable for being placed in the front compartment. Therefore, the autonomous driving computing platform can be usually placed only inside the cockpit.

However, the autonomous driving computing platform with air-cooled heat dissipation has a large size, and therefore it is difficult to find an appropriate installation location in the cockpit. In addition, if the autonomous driving computing platform with air-cooled heat dissipation is placed inside the cockpit, noise generated by a fan of the autonomous driving computing platform definitely causes deterioration of a noise, vibration, and harshness (NVH) indicator of the vehicle, affecting ride comfort of a passenger.

SUMMARY

Embodiments of this application provide a heat dissipation apparatus, which may be configured to dissipate heat for an autonomous driving computing platform. This can reduce a size of the autonomous driving computing platform, facilitate installation of the autonomous driving computing platform inside a vehicle, and does not affect an NVH indicator of the vehicle.

According to a first aspect, an embodiment of this application provides a heat dissipation apparatus, including a liquid storage tank, where the liquid storage tank stores a liquid coolant, a liquid pump, where the liquid pump is connected to the liquid storage tank through a first liquid cooling pipe, a first heat exchanger, where the first heat exchanger is connected to the liquid pump through a first extension pipeline, a second heat exchanger, where the second heat exchanger is connected to the first heat exchanger through a second extension pipeline, and the second heat exchanger is connected to the liquid storage tank through a second liquid cooling pipe, and a heat dissipation fan, where the heat dissipation fan is disposed facing the second heat exchanger. The liquid pump is configured to extract the liquid coolant from the liquid storage tank, and pressurize the liquid coolant, to enable the liquid coolant to circulate sequentially along the liquid storage tank, the first heat exchanger, and the second heat exchanger. The first heat exchanger is configured to be in contact with a heat source, absorb heat from the heat source, and transfer the heat to the liquid coolant. The heat dissipation fan is configured to generate cooling air for the second heat exchanger, to accelerate air flow around the second heat exchanger. The second heat exchanger is configured to absorb heat from the liquid coolant, and volatilize the heat into air.

The heat dissipation apparatus provided in this embodiment of this application is configured to dissipate heat for an autonomous driving computing platform of a vehicle. The first heat exchanger of the heat dissipation apparatus may be disposed inside the vehicle, and is in contact with a heat emitting component of the autonomous driving computing platform. Components such as the liquid storage tank, the liquid pump, the second heat exchanger, and the heat dissipation fan of the heat dissipation apparatus may be extended outside the vehicle through the first extension pipeline and the second extension pipeline for disposition. When the heat dissipation apparatus operates, the first heat exchanger absorbs heat generated by the autonomous driving computing platform, and transfers the heat to the liquid coolant flowing through the first heat exchanger. The liquid coolant flows out of the vehicle under pressure of the liquid pump, and transfers the heat carried by the liquid coolant to the second heat exchanger located outside the vehicle. The heat in the second heat exchanger is quickly released into air outside the vehicle under an action of the cooling air of the heat dissipation fan. It may be learned that, in the heat dissipation apparatus provided in this embodiment of this application, only one heat exchanger needs to be installed on the autonomous driving computing platform, and no other component such as a fan needs to be installed. Therefore, a size of the autonomous driving computing platform can be reduced. In addition, because the heat dissipation fan that can generate noise is disposed outside the vehicle, a passenger inside the vehicle does not sense noise of the heat dissipation fan. Therefore, the heat dissipation apparatus in this embodiment of this application does not affect an NVH indicator of the vehicle, and helps improve ride comfort of the passenger.

In an implementation, the heat dissipation apparatus further includes a housing. The liquid storage tank, the liquid pump, the heat dissipation fan, and the second heat exchanger are disposed inside the housing. The first heat exchanger is disposed outside the housing, and is disposed independently of the housing. In this way, when the heat dissipation apparatus is installed on the vehicle, only the first heat exchanger needs to be installed inside the vehicle, and the housing is installed outside the vehicle. This reduces time and labor.

In an implementation, the first heat exchanger includes a heat exchange plate and a first thermally conductive pipeline disposed inside the heat exchange plate. Both ends of the first thermally conductive pipeline are located on a surface of the heat exchange plate, one end is a liquid inlet of the first heat exchanger, and the other end is a liquid outlet of the first heat exchanger. The heat exchange plate is configured to be in contact with the heat source, absorb heat from the heat source, and transfer the heat to the liquid coolant in the first thermally conductive pipeline.

In an implementation, the heat exchange plate includes a first plate surface. The first plate surface is a planar structure, and the first plate surface is configured to be in contact with the heat source.

In an implementation, the heat exchange plate further includes a second plate surface. The second plate surface is opposite to the first plate surface, and the second plate surface includes a plurality of heat sink fins disposed at intervals. In this way, the heat exchange plate can form a large contact area with air through the heat sink fins, so that specific heat dissipation performance is provided.

In an implementation, the second heat exchanger includes a fin structure and a second thermally conductive pipeline. The fin structure is formed by stacking a plurality of metal sheets, and there is a gap between two adjacent metal sheets. The second thermally conductive pipeline shuttles back and forth between the plurality of metal sheets, one end of the second thermally conductive pipeline is a liquid inlet of the second heat exchanger, and the other end is a liquid outlet of the second heat exchanger. The fin structure is configured to absorb heat of the liquid coolant in the second thermally conductive pipeline, and volatilize the heat into air.

In an implementation, the metal sheets are disposed in parallel with an air duct direction of the heat dissipation fan. In this way, cooling air generated by the heat dissipation fan can pass through the gaps between the metal sheets and take away heat on the metal sheets, to avoid heat accumulation near the metal sheets.

In an implementation, the first extension pipeline includes a third liquid cooling pipe and a first extension pipe. One end of the third liquid cooling pipe is connected to the liquid pump. One end of the first extension pipe is connected to the liquid inlet of the first heat exchanger. Each of the other end of the third liquid cooling pipe and the other end of the first extension pipe is provided with a quick connector, and the third liquid cooling pipe is connected to the first extension pipe through the quick connectors. In this way, the third liquid cooling pipe and the first extension pipe can implement quick pipeline connection and disconnection through the quick connectors, and liquid leakage can be prevented when the pipeline is disconnected.

In an implementation, the quick connector of the third liquid cooling pipe is disposed on the housing, and is located on an outer side of the housing.

In an implementation, the second extension pipeline includes a fourth liquid cooling pipe and a second extension pipe. One end of the fourth liquid cooling pipe is connected to the liquid inlet of the second heat exchanger. One end of the second extension pipe is connected to the liquid outlet of the first heat exchanger. Each of the other end of the fourth liquid cooling pipe and the other end of the second extension pipe is provided with a quick connector, and the fourth liquid cooling pipe is connected to the second extension pipe through the quick connectors. In this way, the fourth liquid cooling pipe and the second extension pipe can implement quick pipeline connection and disconnection through the quick connectors, and liquid leakage can be prevented when the pipeline is disconnected.

In an implementation, the quick connector of the fourth liquid cooling pipe is disposed on the housing, and is located on an outer side of the housing.

In an implementation, the second heat exchanger is a part of the housing.

In an implementation, the heat source includes a printed circuit board of the autonomous driving computing platform, the printed circuit board includes at least one heat emitting component, and the first heat exchanger is configured to be in contact with the at least one heat emitting component.

According to a second aspect, an embodiment of this application provides a vehicle, including an autonomous driving computing platform and the heat dissipation apparatus according to the first aspect and the implementations of the first aspect. The autonomous driving computing platform and the first heat exchanger of the heat dissipation apparatus are disposed inside the vehicle, and the liquid storage tank, the liquid pump, the second heat exchanger, and the heat dissipation fan of the heat dissipation apparatus are disposed outside the vehicle. The autonomous driving computing platform includes a printed circuit board, the printed circuit board includes at least one heat emitting component, and the first heat exchanger is in contact with the at least one heat emitting component.

In the vehicle provided in this embodiment of this application, only one heat exchanger needs to be installed on the autonomous driving computing platform, and no other component such as a fan needs to be installed. Therefore, a size of the autonomous driving computing platform can be reduced. In addition, because the heat dissipation fan that can generate noise is disposed outside the vehicle, a passenger inside the vehicle does not sense noise of the heat dissipation fan. Therefore, the heat dissipation apparatus in this embodiment of this application does not affect an NVH indicator of the vehicle, and helps improve ride comfort of the passenger.

Figure 1:
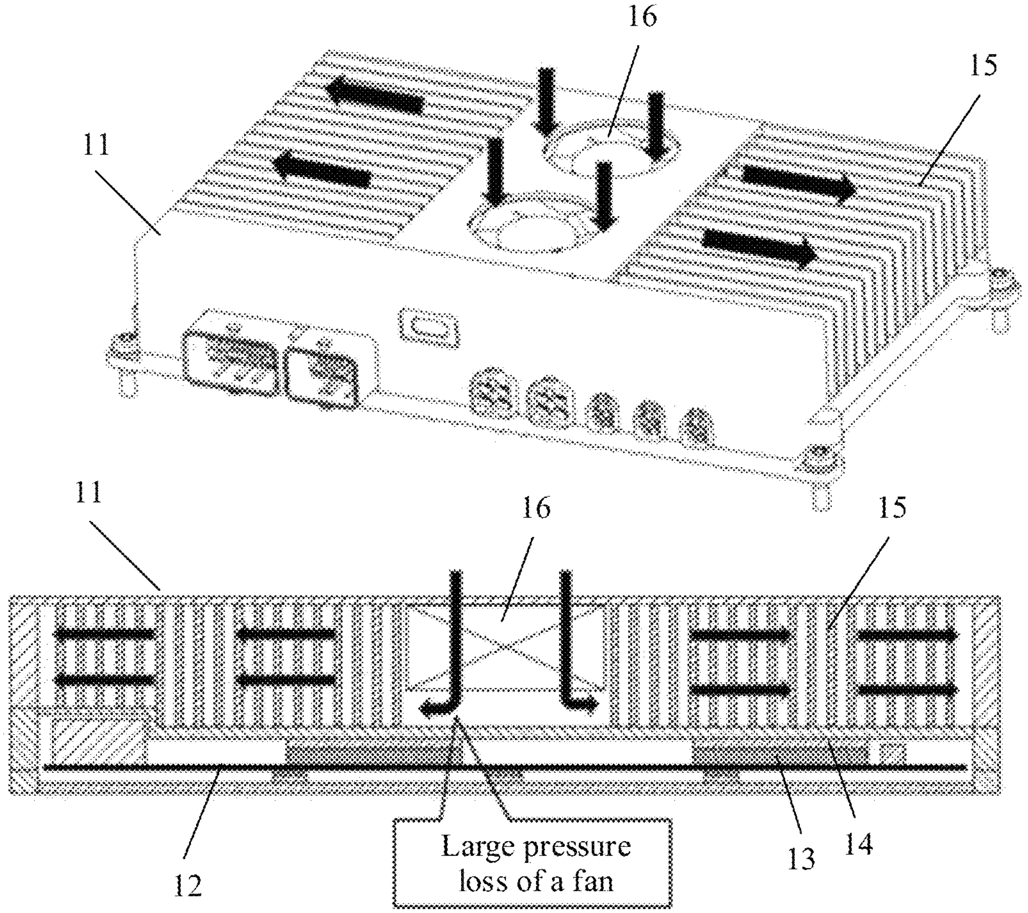
FIG. 1 (Conventional Art)
FIG. 1 is a schematic diagram of an air-cooled heat dissipation structure of an autonomous driving computing platform.

10—heat dissipation apparatus, 21—autonomous driving computing platform, 100—liquid storage tank, 110—liquid coolant, 120—first liquid cooling pipe, 200—liquid pump, 230—first extension pipeline, 231—third liquid cooling pipe, 232—first extension pipe, 233—pipeline connector, 234—pipeline connector, 300—first heat exchanger, 330—connector, 340—second extension pipeline, 341—fourth liquid cooling pipe, 342—second extension pipe, 343—pipeline connector, 344—pipeline connector, 345—clamp, 350—heat exchange plate, 351—first plate surface, 352—second plate surface, 353—heat sink fin, 360—first thermally conductive pipeline, 361—planar pipe wall, 400—heat exchanger, 410—second liquid cooling pipe, 450—metal sheet, 460—second thermally conductive pipeline, 500—heat dissipation fan, 610—heat emitting component, 620—thermal interface material, 700—housing, 710—bottom surface of the housing, and 720—side surface of the housing.

DESCRIPTION OF EMBODIMENTS

An autonomous vehicle (or a self-piloting automobile), a self-driving vehicle, a computer driving vehicle, or a wheeled mobile robot, is an unmanned ground vehicle for transporting power. As an automated vehicle, the autonomous vehicle can sense an environment and navigate without a human operation. The autonomous vehicle can sense the environment through a technology such as a radar, an optical radar, a satellite navigation system (GNSS), and computer vision. A control system equipped by the autonomous vehicle can convert sensing data into an appropriate navigation road sign, an obstacle sign, and a related sign, to update map information, track a location of the autonomous vehicle in real time, and control or assist a driver in controlling a driving behavior of the vehicle in real time.

The control system of the autonomous vehicle, especially a control system of a high-level autonomous vehicle, usually includes an autonomous driving computing platform (or a vehicle-mounted computing module), for example, an MDC. The autonomous driving computing platform can sense an ambient environment through a vehicle-mounted sensor such as a camera, a laser radar, a millimeter-wave radar, or an ultrasonic wave, make a decision based on obtained information, and formulate a corresponding policy based on an appropriate working model, for example, predict motion statuses of the vehicle, another vehicle, a pedestrian, and the like in a future period of time, and plan a collision avoidance path.

The National Highway Traffic Safety Administration (NHTSA) of the United States classifies autonomous driving into six levels. The six levels are listed in ascending order as follows.

L0: No automated configuration. A driver drives a vehicle, and no proactive security configuration is available.

L1: Driving assistance. A vehicle has a specific function to assist a driver in performing a specific task of horizontal or vertical vehicle movement (but not a complex task of changing a lane and overtaking a vehicle at the same time), and the driver is responsible for most of vehicle control capabilities.

L2: Advanced driving assistance. A vehicle can assist a driver in performing horizontal and vertical vehicle movement tasks (where the vehicle can independently complete specific complex tasks). However, the driver needs to monitor the vehicle in real time to complete these tasks.

L3: Autonomous driving in a specific scenario. With consent of a vehicle owner, an autonomous driving system can fully intervene in vehicle driving. Certainly, the vehicle owner may correct, at any time, an error that occurs when the vehicle is in an autonomous driving mode.

L4: Advanced autonomous driving. When a vehicle moves, all operations are implemented by an autonomous driving system. In an execution scenario, the vehicle has no illogical performance (no error), and a vehicle owner does not need to perform an operation.

L5: A vehicle can reach a destination through autonomous driving without an operation of a vehicle owner, regardless of whether the vehicle is in a specific execution scenario.

It may be learned that, from the L1 level to the L5 level, more driving behaviors independently completed by the vehicle correspondingly indicates a higher computing power requirement imposed on the autonomous driving computing platform. As computing power of the autonomous driving computing platform improves, power consumption of the autonomous driving computing platform gradually increases from several watts to tens of watts or even hundreds of watts. An increase of power consumption of the autonomous driving computing platform leads to an increase of a heat output, and imposes a higher requirement on a heat dissipation capability of the autonomous driving computing platform.

For the autonomous driving computing platform, available heat dissipation manners mainly include natural heat dissipation (or passive heat dissipation), air-cooled heat dissipation, and water-cooled heat dissipation. Natural heat dissipation refers to heat dissipation performed by using the autonomous driving computing platform to perform heat exchange with an environment. In this manner, heat dissipation efficiency is low, and a maximum heat dissipation capability is about 20 watts (W), and cannot meet a heat dissipation requirement of an autonomous driving computing platform at the L3 level or above. Therefore, an air-cooled heat dissipation manner and a water-cooled heat dissipation manner are mainly used for the autonomous driving computing platform at the L3 level or above.

The air-cooled heat dissipation manner and the water-cooled heat dissipation manner of the autonomous driving computing platform may be usually implemented through a thermal management system of a vehicle. However, vehicles of different power types have different available heat dissipation manners.

For example, a thermal management system of a new energy vehicle usually includes four parts: a battery cooling system, an air conditioning system, a motor cooling system, and a reducer cooling system. Water-cooled heat dissipation is used for the battery cooling system and the motor cooling system, and maximum water temperatures of the battery cooling system and motor cooling system are about 45 degrees Celsius (° C.) and 64° C. respectively. Therefore, in the new energy vehicle, the battery cooling system or the motor cooling system may also perform water-cooled heat dissipation for the autonomous driving computing platform, and has a natural advantage in implementing heat dissipation of the autonomous driving computing platform.

Different from that of the new energy vehicle, a thermal management system of a conventional fossil fuel-powered vehicle usually includes two parts: an air conditioning thermal management system and an engine thermal management system. The air conditioning thermal management system has no liquid cooling pipeline, and a water temperature of the engine thermal management system may be higher than 90° C. Such a high water temperature makes it impossible for the engine thermal management system to perform water-cooled heat dissipation for the autonomous driving computing platform. Therefore, in the conventional fossil fuel-powered vehicle, the air-cooled heat dissipation manner is usually used for an autonomous driving computing platform with high computing power.

A front compartment of the conventional fossil fuel-powered vehicle has components such as an engine, a reduction box, and a battery, and usually has no sufficient space for installing an autonomous driving computing platform device. In addition, an operating temperature of the front compartment of the conventional fossil fuel-powered vehicle is usually between −40° C. and 140° C., and is extremely cold or high. Therefore, except some small-sized, low-power-consumption, and high-specification vehicle-mounted electronic components such as an electronic control unit (ECU), another vehicle-mounted electronic component is not considered for placement, and a large-sized and high-power-consumption vehicle-mounted electronic component such as an autonomous driving computing platform is not suitable for placement.

It may be learned that, due to impact of installation space and an environmental factor, even an autonomous driving computing platform with air-cooled heat dissipation is not suitable to be placed in the front compartment of the conventional fossil fuel-powered vehicle. Therefore, in the conventional fossil fuel-powered vehicle, the autonomous driving computing platform can be disposed only inside a cockpit.

FIG. 1 is a schematic diagram of an air-cooled heat dissipation structure of an autonomous driving computing platform. As shown in FIG. 1, the air-cooled heat dissipation structure includes a housing 11, a mainboard 12 of the autonomous driving computing platform is disposed in the housing 11, and a heat emitting component 13 on the mainboard 12 is connected to the housing 11 through a thermal interface material 14. A part that is of the housing 11 and that is connected to the heat emitting component 13 includes a heat sink 15. A fan 16 is disposed on the top of the housing 11 above the heat emitting component 13, and is configured to supply air to the inside of the housing 11. Generally, the fan 16 may be disposed in the middle of the top of the housing 11, so that after supply airflow reaches a side close to the heat emitting component 13, the supply airflow is distributed along the heat sink 15 to two sides of the housing 11, to form an air duct shown in FIG. 1. After heat generated by each heat emitting component 13 on the mainboard 12 is transferred to the heat sink 15, the heat is spread into the air under an action of airflow in the air duct.

However, for example, the autonomous driving computing platform with air-cooled heat dissipation shown in FIG. 1 has the following problems in actual application.

1. System reliability is poor. If a fan in the system fails due to a fault, an air-cooled heat dissipation capability decreases sharply. As a result, the autonomous driving computing platform encounters a problem such as chip overheating frequency reduction, overheating self-protection triggering, or component overheating damage, and even causes breakdown of the autonomous driving computing platform.
2. A pressure loss of the fan is large. In the housing of the autonomous driving computing platform, because of a change of an air duct direction and impact of structural resistance, a pressure loss of the air duct usually can meet a heat dissipation requirement of only a 100 W power level, and cannot meet a heat dissipation requirement of an autonomous driving computing platform at a level higher than the L4 in the future.
3. A device size is large. After an air-cooled heat dissipation structure is installed in the autonomous driving computing platform, the device size becomes larger because components such as the housing, the heat sink, and the fan are added. Therefore, it is difficult to find an installation location that can be accommodated inside a vehicle.
4. In addition, NVH of a vehicle is an important indicator for evaluating vehicle ride comfort, and is also an important indicator for improvement made by major automobile manufacturers. However, if the autonomous driving computing platform with air-cooled heat dissipation is placed in the cockpit, noise generated by the fan of the autonomous driving computing platform definitely causes deterioration of an NVH indicator.

To resolve the foregoing problems, an embodiment of this application provides a heat dissipation apparatus. The apparatus is independent of a thermal management system of a vehicle, may be configured to dissipate heat for various vehicle-mounted heat emitting modules including the autonomous driving computing platform, and may be applied to both a new energy vehicle and a conventional fossil fuel-powered vehicle.

Figure 2:
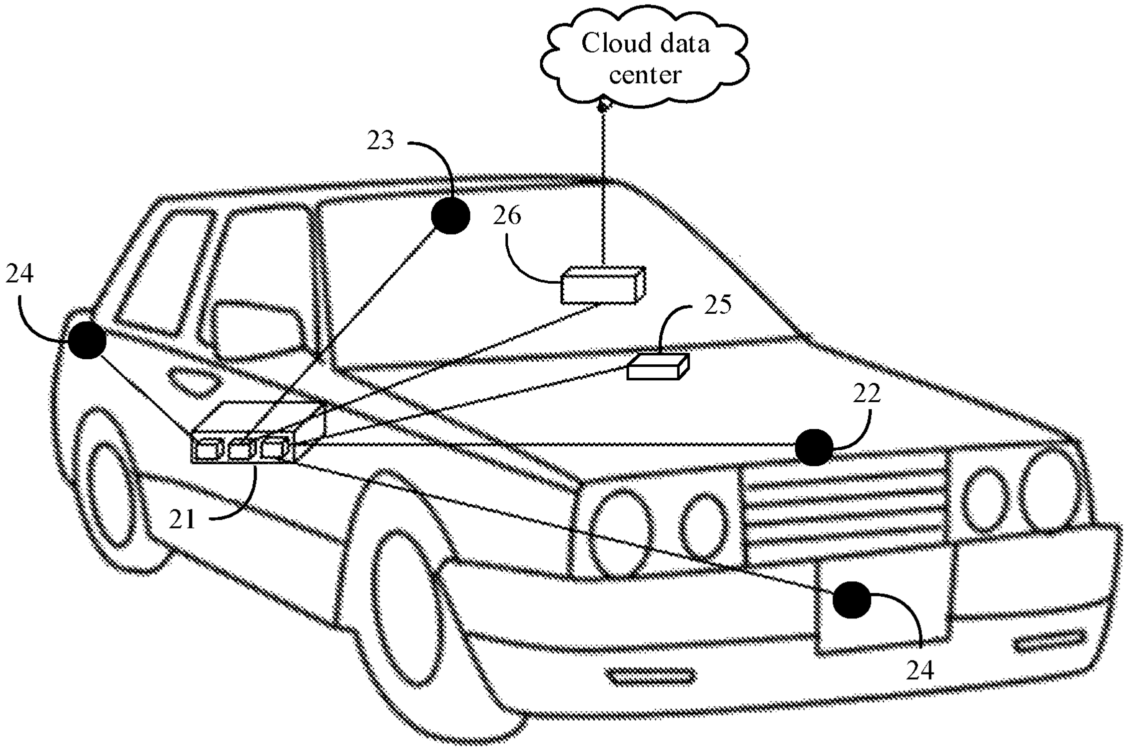
FIG. 2 shows a scenario in which an autonomous driving computing platform is installed in a vehicle.

To help a person skilled in the art to deeply understand the technical solutions of this application, FIG. 2 shows a scenario in which an autonomous driving computing platform 21 is installed in a vehicle. As shown in FIG. 2, the autonomous driving computing platform 21 is usually installed inside a vehicle, for example, installed in a center console or under a seat. In collaboration with the autonomous driving computing platform 21, various types of sensors such as a laser radar 22, a camera 23, and a millimeter-wave radar 24 are further installed in the vehicle, to detect an environment in which the vehicle is located, a status of the vehicle, and the like, and feed back detected data to the autonomous driving computing platform 21. The autonomous driving computing platform 21 performs a real-time inference operation on the received data by using an artificial intelligence (AI) chip, for example, a neuralnetwork processing unit (NPU), built in the autonomous driving computing platform 21, generates an operation instruction based on an operation result, and delivers the operation instruction to a vehicle control unit (VCU) 25. The VCU 25 controls vehicle braking, for example, braking or deceleration, based on the operation instruction, to implement autonomous driving functions of various levels. A computing module may further upload data to a cloud data center at a back end of a network through a telematics communication terminal (or telematics box (T-BOX)) 26. Generally, information may be transmitted between the autonomous driving computing platform 21 and the camera 23 through a gigabit multimedia serial link (GMSL). Information may be transmitted between the autonomous driving computing platform 21 and the laser radar 22 through an automotive Ethernet link. Information may be transmitted between the autonomous driving computing platform 21 and the VCU 25 or between a motor control unit (MCU) and a battery management system (BMS) through a Controller Area Network (CAN) bus. Information may be transmitted between the autonomous driving computing platform 21 and the millimeter-wave radar 24 through a CAN bus. Information may be transmitted between the autonomous driving computing platform 21 and an ultrasonic radar (not shown in FIG. 2) through a Local Interconnect Network (LIN) bus. Information may be transmitted between the autonomous driving computing platform 21 and the T-BOX 26 through an Ethernet link.

Figure 3:
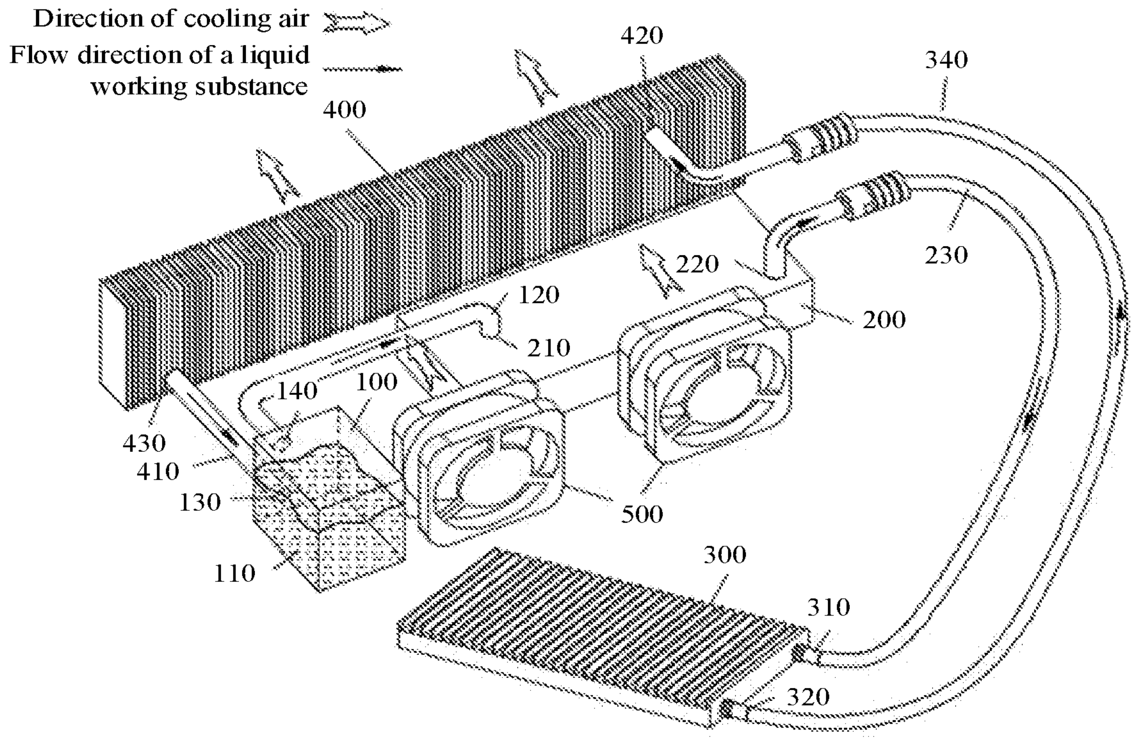
FIG. 3 is a schematic diagram of a structure of a heat dissipation apparatus according to an embodiment of this application.

FIG. 3 is a schematic diagram of a structure of a heat dissipation apparatus according to an embodiment of this application. As shown in FIG. 3, the heat dissipation apparatus may include a liquid storage tank 100, a liquid pump 200, a first heat exchanger 300, a second heat exchanger 400, and a heat dissipation fan 500. The liquid storage tank 100 stores a liquid coolant 110, the liquid pump 200 is connected to the liquid storage tank 100 through a first liquid cooling pipe 120, the first heat exchanger 300 is connected to the liquid pump 200 through a first extension pipeline 230, the second heat exchanger 400 is connected to the first heat exchanger 300 through a second extension pipeline 340, and the liquid storage tank 100 is connected to the second heat exchanger 400 through a second liquid cooling pipe 410. In this way, according to the foregoing pipeline connection relationship, the heat dissipation apparatus forms a circulation loop that the liquid coolant 110 flows from the liquid storage tank 100 to the liquid pump 200 through the first liquid cooling pipe 120, flows to the first heat exchanger 300 through the first extension pipeline 230, flows to the second heat exchanger 400 through the second extension pipeline 340, and flows back to the liquid storage tank 100 through the second liquid cooling pipe 410.

The following further describes structures and functions of the components of the heat dissipation apparatus according to this embodiment of this application with reference to FIG. 3.

The liquid storage tank 100 may be a sealed hollow tank body. The liquid storage tank 100 may be made into various shapes, for example, a cube shape, a spherical shape, or a cylindrical shape. This is not limited in this embodiment of this application. The liquid storage tank 100 may be made of metal, for example, copper, aluminum, carbon steel, stainless steel, or alloy steel, or may be made of heat-resistant non-metal. This is not limited in this embodiment of this application. The liquid storage tank 100 may include at least one liquid inlet 130 and at least one liquid outlet 140. The liquid inlet 130 of the liquid storage tank 100 is configured to enable the liquid coolant 110 of the second heat exchanger 400 to flow into the liquid storage tank 100, and the liquid outlet 140 of the liquid storage tank 100 is configured to enable the liquid coolant 110 in the liquid storage tank 100 to flow into the liquid pump 200.

In this embodiment of this application, for example, the liquid coolant 110 may be a substance such as freon, ammonia, acetone, methanol, alcohol, heptane, or water, or a combination of the foregoing substances. This is not limited in this embodiment of this application either.

The liquid pump 200 in this embodiment of this application includes at least one liquid inlet 210 and at least one liquid outlet 220. The liquid inlet 210 of the liquid pump 200 is connected to the liquid outlet 140 of the liquid storage tank 100 through the first liquid cooling pipe 120. The liquid pump 200 is configured to extract the liquid coolant 110 from the liquid storage tank 100 through the first liquid cooling pipe 120, and pressurize the liquid coolant 110, to enable the liquid coolant 110 to flow out from the liquid outlet 220 of the liquid pump 200 to the first extension pipeline 230 under an action of pressure.

A type of the liquid pump 200 is not limited in this embodiment of this application. For example, the liquid pump 200 may be a positive displacement pump, or may be a power-driven pump. The positive displacement pump may include, for example, reciprocating pumps (for example, a plunger pump) or rotor pumps (for example, a screw liquid pump) of various structures. The power-driven pump may include, for example, centrifugal pumps and peripheral pumps of various structures. Considering that the heat dissipation apparatus in this embodiment of this application may be applied to an autonomous driving computing platform of a vehicle, and the vehicle usually easily obtains a direct current power supply as a power source of the liquid pump 200, a centrifugal pump driven by a direct current motor is preferably used as the liquid pump 200 in this embodiment of this application, to facilitate implementation of the solutions.

The first heat exchanger 300 in this embodiment of this application may be made of a metal material with good thermal conductivity, for example, copper, aluminum, carbon steel, stainless steel, or alloy steel. The first heat exchanger 300 includes at least one liquid inlet 310 and at least one liquid outlet 320. The liquid inlet 310 of the first heat exchanger 300 is connected to the liquid outlet 220 of the liquid pump 200 through the first extension pipeline 230, and an internal pipeline or cavity for accommodating the liquid coolant 110 is provided between the liquid inlet 310 and the liquid outlet 320 of the first heat exchanger 300. Under pressure of the liquid pump 200, the liquid coolant 110 flowing out from the liquid outlet 220 of the liquid pump 200 flows into the internal pipeline or cavity of the first heat exchanger 300 from the liquid inlet 310 of the first heat exchanger 300 through the first extension pipeline 230, and flows out from the liquid outlet 320 of the first heat exchanger 300 to the second extension pipeline 340.

The second heat exchanger 400 in this embodiment of this application may be made of a metal material with good thermal conductivity, for example, copper, aluminum, carbon steel, stainless steel, or alloy steel. The second heat exchanger 400 includes at least one liquid inlet 420 and at least one liquid outlet 430. The liquid inlet 420 of the second heat exchanger 400 is connected to the liquid outlet 320 of the first heat exchanger 300 through the second extension pipeline 340, and the liquid outlet 430 of the second heat exchanger 400 is connected to the liquid inlet 130 of the liquid storage tank 100 through the second liquid cooling pipe 410. An internal pipeline or cavity for accommodating the liquid coolant 110 is provided between the liquid inlet 420 and the liquid outlet 430 of the second heat exchanger 400, and a heat sink fin may be further provided outside the internal pipeline or cavity of the second heat exchanger 400. For example, the heat sink fin is a heat sink fin of a fin structure. Under pressure of the liquid pump 200, the liquid coolant 110 flowing out from the liquid outlet 320 of the first heat exchanger 300 flows into the internal pipeline or cavity of the second heat exchanger 400 from the liquid inlet 420 of the second heat exchanger 400 through the second extension pipeline 340, flows out from the liquid outlet 430 of the second heat exchanger 400 to the second liquid cooling pipe 410, and finally flows back to the liquid storage tank 100 through the second liquid cooling pipe 410.

The heat dissipation fan 500 in this embodiment of this application may include a single fan, or include a fan group including a plurality of fans. When the heat dissipation fan 500 includes a plurality of fans, the plurality of fans may be disposed in parallel, and therefore cooling air generated by the plurality of fans has a same airflow direction. The second heat exchanger 400 is disposed in a downstream direction of an air duct of the heat dissipation fan 500. In this way, when the heat dissipation fan 500 operates, cooling air generated by the heat dissipation fan 500 directly blows the second heat exchanger 400, to accelerate air flow around the second heat exchanger 400 and take away heat. The heat dissipation apparatus in this embodiment of this application may be applied to the autonomous driving computing platform of the vehicle, and the vehicle usually easily obtains a direct current power supply. Therefore, the heat dissipation fan 500 may be powered by the direct current power supply of the vehicle.

Figure 4:
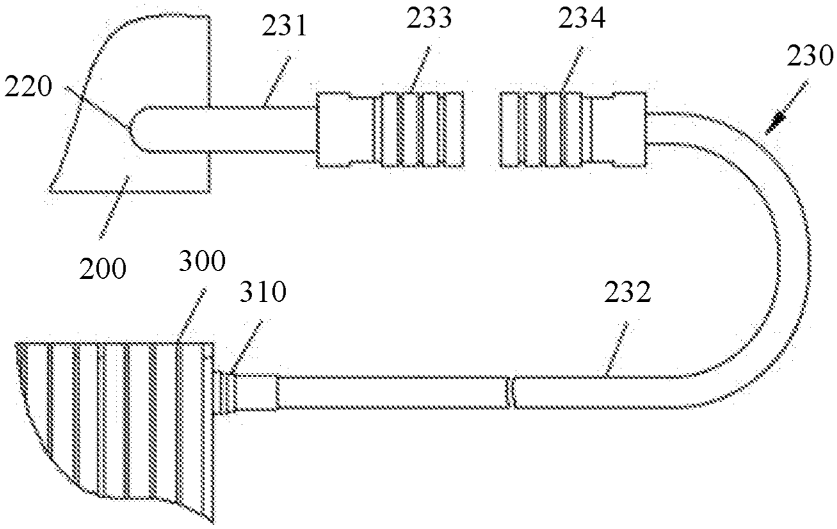
FIG. 4 is a schematic diagram of a structure of a first extension pipeline according to an embodiment of this application.

FIG. 4 is a schematic diagram of a structure of the first extension pipeline 230 according to an embodiment of this application. As shown in FIG. 4, the first extension pipeline 230 includes a third liquid cooling pipe 231 and a first extension pipe 232. One end of the third liquid cooling pipe 231 is connected to the liquid outlet of the liquid pump 200, and the other end is provided with a pipeline connector 233. The first extension pipe 232 is preferably made of a freely bendable hose material, and may be made of a metal material or a non-metal material. One end of the first extension pipe 232 is connected to the liquid inlet 310 of the first heat exchanger 300, and the other end is provided with a pipeline connector 234 that can be connected to the pipeline connector 233 of the third liquid cooling pipe 231. The third liquid cooling pipe 231 is connected to the first extension pipe 232 through a connection between the pipeline connector 233 and the pipeline connector 234.

Figure 5:
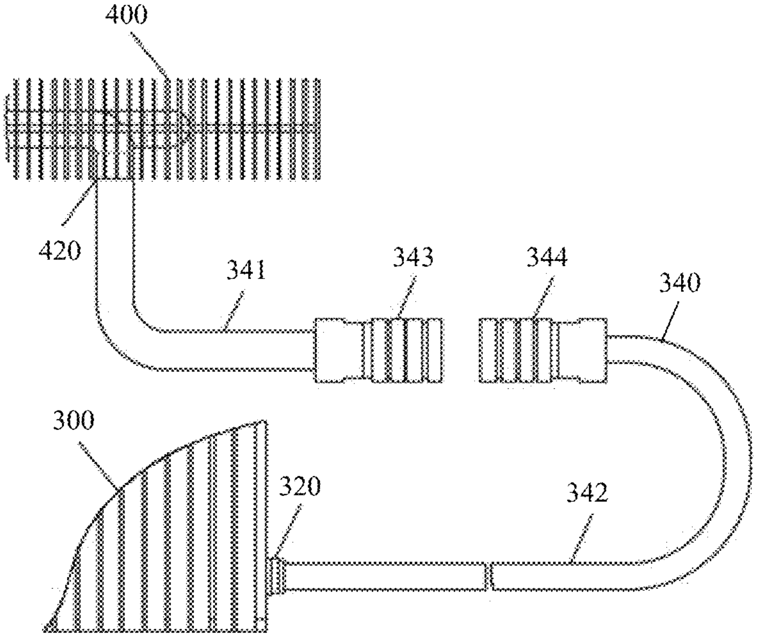
FIG. 5 is a schematic diagram of a structure of a second extension pipeline according to an embodiment of this application.

FIG. 5 is a schematic diagram of a structure of the second extension pipeline 340 according to an embodiment of this application. As shown in FIG. 5, the second extension pipeline 340 includes a fourth liquid cooling pipe 341 and a second extension pipe 342. One end of the fourth liquid cooling pipe 341 is connected to the liquid inlet 420 of the second heat exchanger 400, and the other end is provided with a pipeline connector 343. The second extension pipe 342 is preferably made of a freely bendable hose material, and may be made of a metal material or a non-metal material. One end of the second extension pipe 342 is connected to the liquid outlet 320 of the first heat exchanger 300, and the other end is provided with a pipeline connector 344 that can be connected to the pipeline connector 343 of the fourth liquid cooling pipe 341. The fourth liquid cooling pipe 341 is connected to the second extension pipe 342 through a connection between the pipeline connector 343 and the pipeline connector 344.

In this embodiment of this application, the first liquid cooling pipe 120, the second liquid cooling pipe 410, the third liquid cooling pipe 231, and the fourth liquid cooling pipe 341 each are preferably made of a metal material, for example, copper, aluminum, carbon steel, stainless steel, or alloy steel. A shape of a pipe body may be a circular pipe or another special-shaped pipe body, for example, a flat pipe, an elliptical pipe, a rectangular pipe, or a corrugated pipe. Shapes of pipe bodies of the liquid cooling pipes are not limited in this embodiment of this application.

In this embodiment of this application, the pipeline connector 233 of the third liquid cooling pipe 231, the pipeline connector 343 of the fourth liquid cooling pipe 341, the pipeline connector 234 of the first extension pipe 232, and the pipeline connector 344 of the second extension pipe 342 each are preferably a quick connector. The quick connector is a connector that can implement a pipeline connection or disconnection without a tool. When the quick connector is not connected, the quick connector can seal a pipeline through a structure such as a valve in the quick connector to prevent liquid leakage. When the quick connector is connected, the quick connector can connect a pipeline to enable liquid to flow in the pipeline.

In this embodiment of this application, the first liquid cooling pipe 120 may be connected to the liquid outlet 140 of the liquid storage tank 100, the first liquid cooling pipe 120 may be connected to the liquid inlet 210 of the liquid pump 200, the second liquid cooling pipe 410 may be connected to the liquid inlet 130 of the liquid storage tank 100, the second liquid cooling pipe 410 may be connected to the liquid outlet 430 of the second heat exchanger 400, the third liquid cooling pipe 231 may be connected to the liquid outlet 220 of the liquid pump 200, the first extension pipe 232 may be connected to the liquid inlet 310 of the first heat exchanger 300, the second extension pipe 342 may be connected to the liquid outlet 320 of the first heat exchanger 300, and the fourth liquid cooling pipe 341 may be connected to the liquid inlet 420 of the second heat exchanger 400 in any implementable pipeline connection manner.

In an optional implementation, any two components that need to be connected may implement a pipeline connection in a welding manner. The manner is preferably applicable to a scenario in which the two components that need to be connected are made of a metal material, for example, a connection between the first liquid cooling pipe 120 and the liquid outlet 140 of the liquid storage tank 100. The welding may be a process such as gas welding, arc welding (for example, argon shielded welding), electric resistance welding, laser welding, or induction welding. This is not limited in this embodiment of this application.

In an optional implementation, a joint between any two components that need to be connected may be provided with a connector (for example, a quick connector), so that the two components are connected through the connector.

Figure 6:
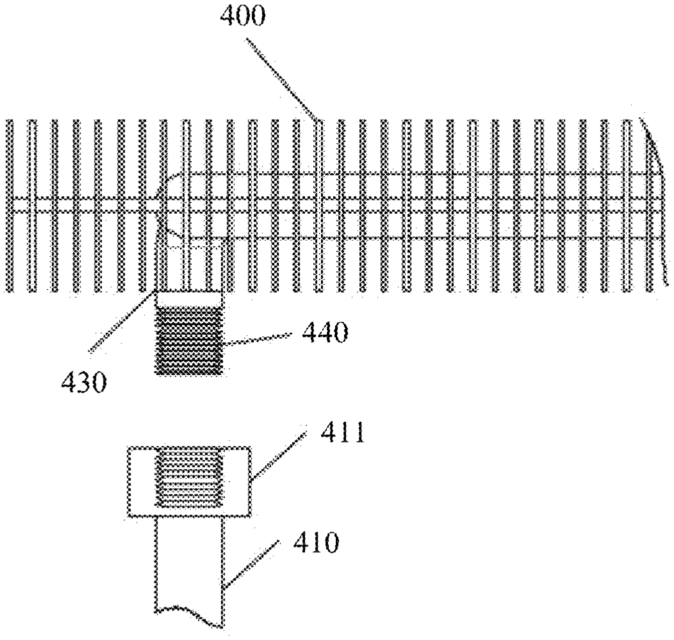
FIG. 6 is a schematic diagram of a pipeline connection manner according to an embodiment of this application.

In an optional implementation, the joint between any two components that need to be connected may be provided with a female screw thread and a male screw thread that cooperate with each other, to implement a threaded connection. The second liquid cooling pipe 410 and the liquid outlet 430 of the second heat exchanger 400 are used as an example. As shown in FIG. 6, one end that is of the second liquid cooling pipe 410 and that is configured to connect to the second heat exchanger 400 may be provided with a connector 411 with a female screw thread, and the liquid outlet 430 of the second heat exchanger 400 may also be provided with a connector 440 that has a male screw thread and that matches the connector 411. In this way, the second liquid cooling pipe 410 may be connected to the liquid outlet of the second heat exchanger 400 through the threads.

Figure 7:
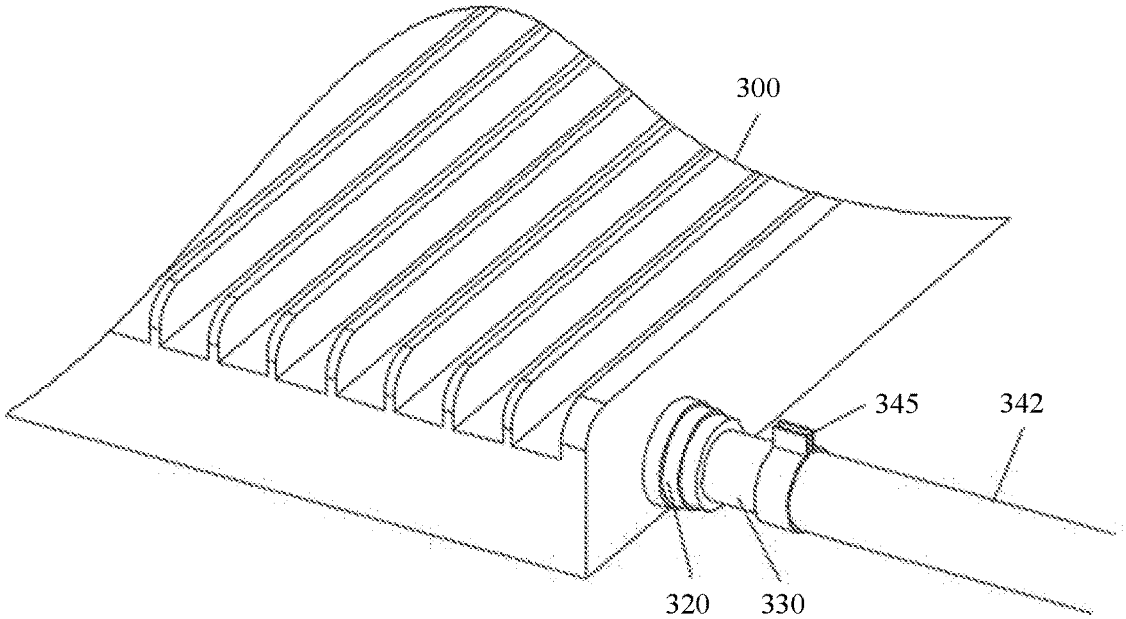
FIG. 7 is a schematic diagram of another pipeline connection manner according to an embodiment of this application.

In an optional implementation, any two components that need to be connected may implement a pipeline connection through a clamp. The manner is preferably applicable to a scenario in which the two components that need to be connected include a hose material. The second extension pipe 342 and the liquid outlet 320 of the first heat exchanger 300 are used as an example. As shown in FIG. 7, when the second extension pipe 342 is a hose, the liquid outlet 320 of the first heat exchanger 300 may be provided with a connector 330 that matches an inner diameter of the second extension pipe 342, and the second extension pipe 342 may be sleeved on the connector 330 to form interference fit or clearance fit. Then, fastening of and a sealed connection between the second extension pipe 342 and the connector 330 are implemented through a clamp 345.

Figure 8:
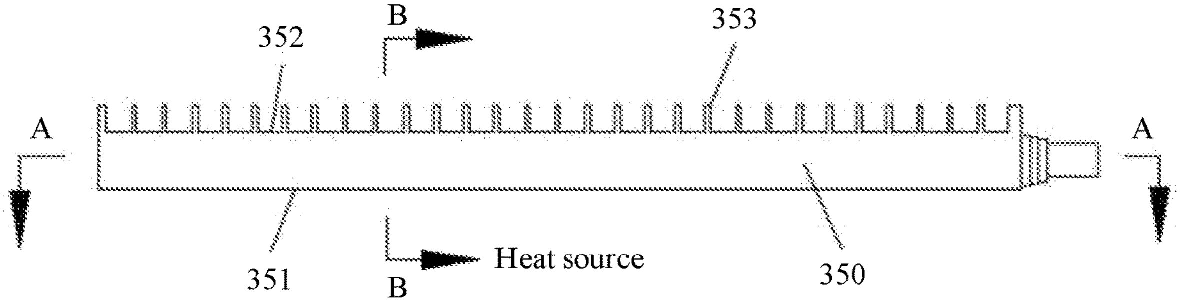
FIG. 8 is a schematic diagram of a structure of a first heat exchanger according to an embodiment of this application.

FIG. 8 is a schematic diagram of a structure of the first heat exchanger 300 according to an embodiment of this application. As shown in FIG. 8, the first heat exchanger 300 includes a heat exchange plate 350. The heat exchange plate 350 is preferably a flat plate structure, and includes a first plate surface 351 configured to be in contact with a heat source and a second plate surface 352 disposed opposite to the first plate surface 351. The first plate surface 351 is a smooth and flat planar structure, and a heat dissipation structure is provided on the second plate surface 352. For example, the heat dissipation structure may include a plurality of heat sink fins 353 disposed on the second plate surface 352 at intervals. In this way, the heat exchange plate 350 can form a large contact area with air through the heat sink fins 353, so that specific heat dissipation performance is provided.

The heat exchange plate 350 may be made of a metal material with good thermal conductivity, for example, copper, aluminum, carbon steel, stainless steel, or alloy steel. A lightweight metal, for example, aluminum or aluminum magnesium alloy, is preferably used, to reduce weight.

Figure 9:
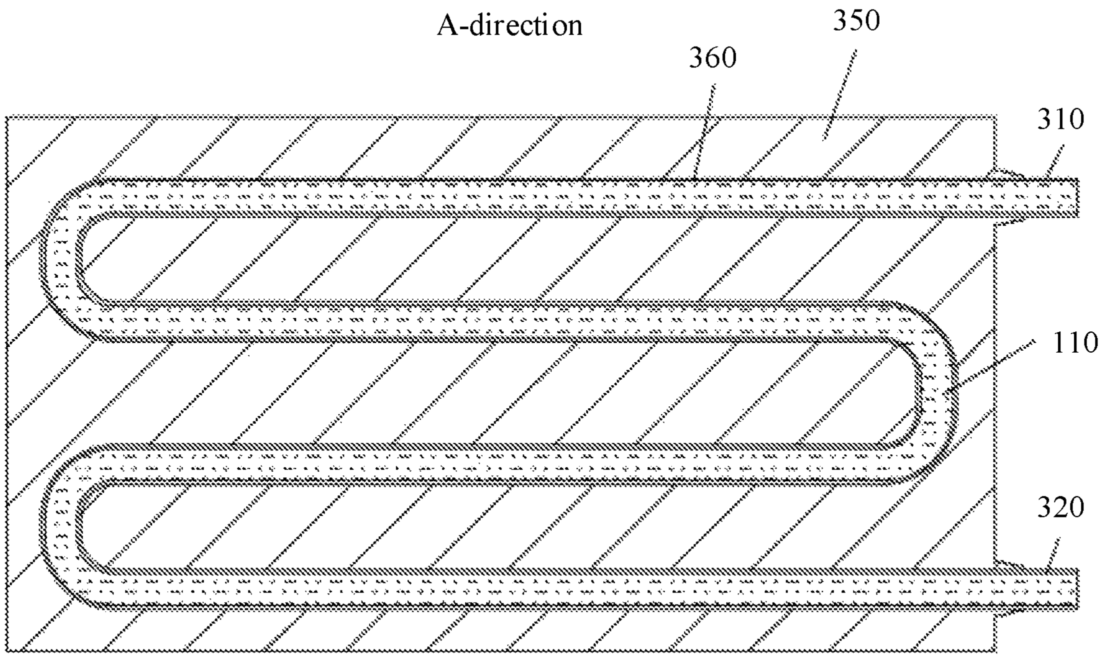
FIG. 9 is an A-direction sectional view of a first heat exchanger according to an embodiment of this application.

FIG. 9 is an A-direction sectional view of the first heat exchanger 300 according to an embodiment of this application. As shown in FIG. 9, the heat exchange plate 350 is preferably of a solid structure. A first thermally conductive pipeline 360 is disposed inside the heat exchange plate 350. Both ends of the first thermally conductive pipeline 360 are located on a surface of the heat exchange plate 350. One end forms the liquid inlet 310 of the first heat exchanger 300, and the other end forms the liquid outlet 320 of the first heat exchanger 300. The first thermally conductive pipeline 360 is arranged in a serpentine shape inside the first heat exchanger 300. In this way, the first thermally conductive pipeline 360 is long inside the heat exchange plate 350, to form a large contact area with the heat exchange plate 350. This helps the heat exchange plate 350 transfer heat to the liquid coolant 110 in the first thermally conductive pipeline 360.

In this embodiment of this application, a shape and a size of the heat exchange plate 350 may be determined based on an area of the heat source, so that the first plate surface 351 of the heat exchange plate 350 can be in full contact with the heat source. In specific application, the heat source may be a heat emitting component such as a semiconductor chip, a resistor, or a capacitor on a PCB of the autonomous driving computing platform.

Figure 10:
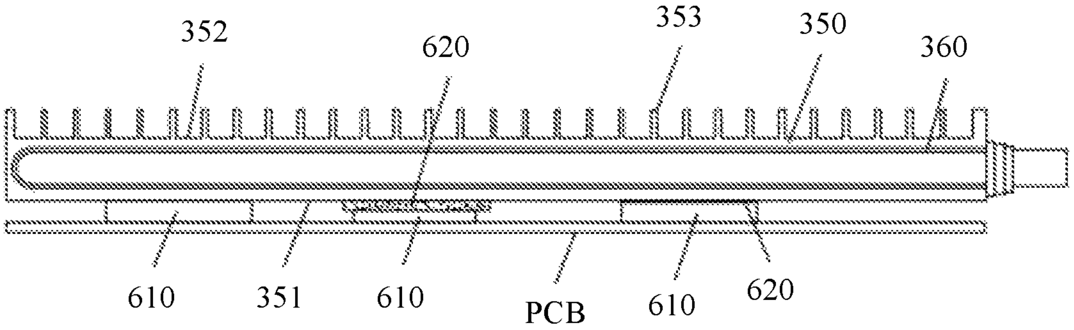
FIG. 10 is a schematic diagram of installing a first heat exchanger and a printed circuit board (PCB) of an autonomous driving computing platform according to an embodiment of this application.

FIG. 10 is a schematic diagram of installing the first heat exchanger 300 and the PCB of the autonomous driving computing platform according to an embodiment of this application. As shown in FIG. 10, the first heat exchanger 300 is disposed on a surface of the PCB on which a heat emitting component 610 is installed, and may be fastened to the PCB by using a screw, a fixture, a snap-fit, or the like, so that the first plate surface 351 of the heat exchange plate 350 is attached to the heat emitting component 610. In this way, heat generated by the heat emitting component 610 may be transferred to the heat exchange plate 350, and then the heat exchange plate 350 transfers the heat to the liquid coolant in the first thermally conductive pipeline 360.

It may be understood that, when a plurality of heat emitting components 610 are installed on the PCB, heights of the heat emitting components 610 may be different. As a result, there may be gaps between some heat emitting components 610 and the first heat exchanger 300. Therefore, to fill the gaps and improve heat transfer efficiency between the heat emitting components 610 and the first heat exchanger 300, a person skilled in the art may add thermal interface materials 620 on the heat emitting components 610 before fastening the first heat exchanger 300 to the PCB. For example, thermal grease such as thermally conductive silicone grease or a liquid metal is applied on the heat emitting components 610, or thermal pads such as paraffin or silicone resin are attached on the heat emitting components 610, to fill the gaps. In this way, after the first heat exchanger 300 is fastened to the PCB, the first plate surface 351 may be attached to the heat emitting components 610 through the thermal interface materials 620, and heat generated by the heat emitting components 610 may be transferred to the first heat exchanger 300 through the thermal interface materials 620.

Figure 11:
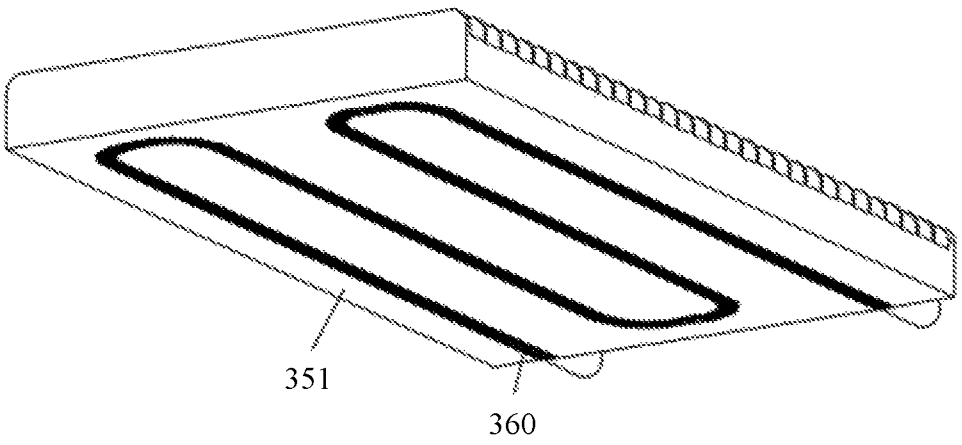
FIG. 11 is a schematic diagram of a structure of another first heat exchanger according to an embodiment of this application.

FIG. 11 is a schematic diagram of a structure of another first heat exchanger 300 according to an embodiment of this application. As shown in FIG. 11, a pipe wall of the first thermally conductive pipeline 360 may be partially or totally exposed on the first plate surface 351. In this way, the pipe wall that is of the first thermally conductive pipeline 360 and that is exposed on the first plate surface 351 may be in direct contact with the heat source, to directly transfer heat of the heat source to the liquid coolant, and improve efficiency of transferring the heat from the heat source to the liquid coolant 110.

Figure 12:
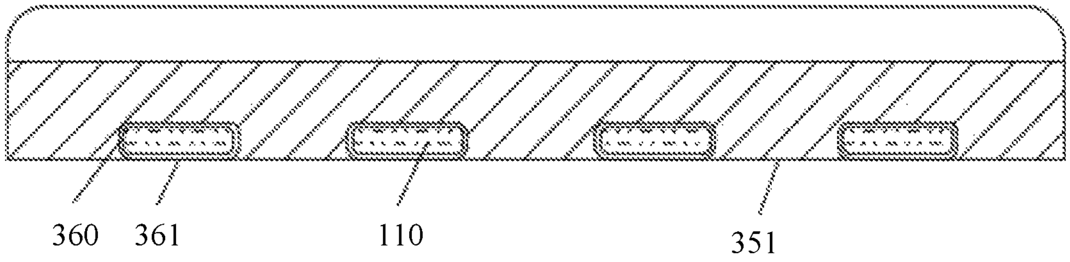
FIG. 12 is a schematic diagram of a cross-sectional shape of a first thermally conductive pipeline according to an embodiment of this application.

In addition, further, as shown in FIG. 12, the first thermally conductive pipeline 360 may be preferably a flat pipe, and the flat pipe may be formed by a circular pipe through pressure extrusion. Compared with the circular pipe, in a case of a same pipe wall circumference, the flat pipe may include a planar pipe wall 361 whose width is close to half of the pipe wall circumference. The planar pipe wall 361 of the first thermally conductive pipeline 360 may be exposed on the first plate surface 351, and may be in a same plane as the first plate surface 351. In this way, a larger contact area may be formed between the planar pipe wall 361 of the first thermally conductive pipeline 360 and the heat source, to help further improve efficiency of transferring heat from the heat source to the liquid coolant 110.

Figure 13:
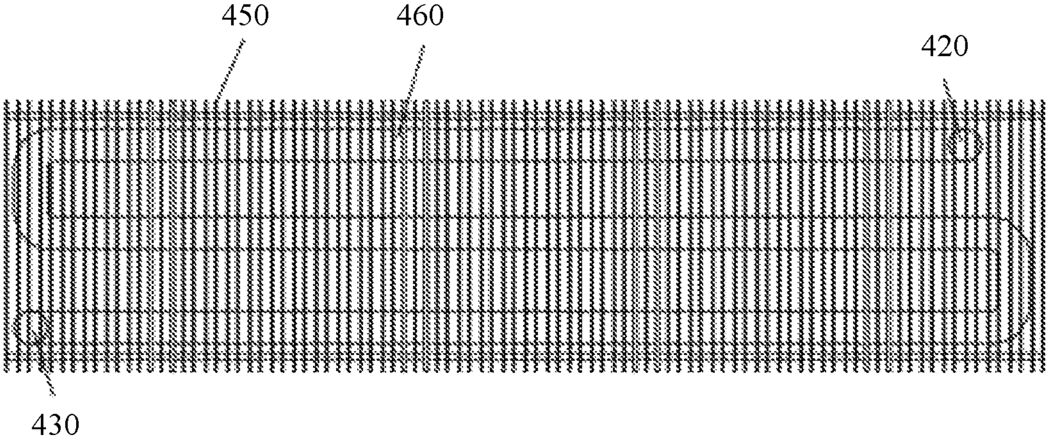
FIG. 13 is a schematic diagram of a structure of a second heat exchanger according to an embodiment of this application.

FIG. 13 is a schematic diagram of a structure of the second heat exchanger 400 according to an embodiment of this application. As shown in FIG. 13, the second heat exchanger 400 includes a fin structure and a second thermally conductive pipeline 460. The fin structure is formed by stacking a plurality of metal sheets 450, and there is a specific gap between two adjacent metal sheets 450. One end of the second thermally conductive pipeline 460 is the liquid inlet 420 of the second heat exchanger 400, and the other end is the liquid outlet 430 of the second heat exchanger 400. The second thermally conductive pipeline 460 shuttles back and forth between the plurality of metal sheets 450 in a serpentine shape, and therefore may transfer heat to the plurality of metal sheets 450. In addition, the metal sheets 450 are preferably parallel to an air duct direction of the heat dissipation fan 500. In this way, cooling air generated by the heat dissipation fan 500 can pass through the gaps between the metal sheets 450 and take away heat on the metal sheets 450, to avoid heat accumulation near the metal sheets 450.

Figure 14:
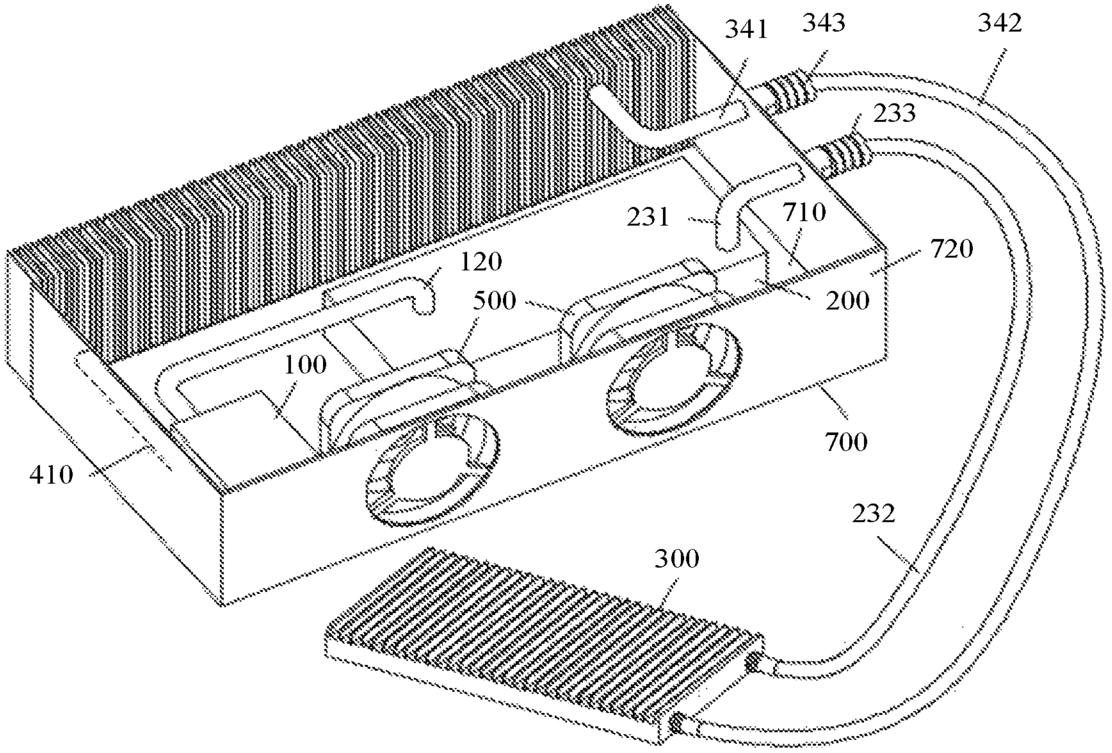
FIG. 14 is a schematic diagram of a structure of a heat dissipation apparatus having a housing according to an embodiment of this application.

In an embodiment, as shown in FIG. 14, the heat dissipation apparatus may further include a housing 700 configured to accommodate some components of the heat dissipation apparatus, for example, the liquid storage tank 100, the liquid pump 200, the first liquid cooling pipe 120, the second liquid cooling pipe 410, the third liquid cooling pipe 231, the fourth liquid cooling pipe 341, and the heat dissipation fan 500. Other components such as the first heat exchanger 300, the first extension pipe 232, and the second extension pipe 342 are disposed outside the housing 700. The housing 700 may be manufactured in various shapes. This is not limited in this embodiment of this application. A rectangular housing is used as an example. The rectangular housing may include a housing bottom surface 710 and a housing side surface 720 disposed around the housing bottom surface 710. The liquid storage tank 100, the liquid pump 200, and the heat dissipation fan 500 may be fastened to the housing bottom surface 710 or the housing side surface 720 by using a screw, a snap-fit, adhesive, or the like. For example, in the structure shown in FIG. 14, the liquid pump 200 is disposed on the housing bottom surface 710, and the liquid storage tank 100 and the heat dissipation fan 500 are disposed on the housing side surface 720.

In an implementation, the second heat exchanger 400 may be disposed inside the housing 700. For example, the second heat exchanger 400 may be fastened to the housing side surface 720 by using a screw, a snap-fit, adhesive, or the like, and is located in a downstream direction of the air duct of the heat dissipation fan 500.

In an implementation, the second heat exchanger 400 may alternatively be integrated with the housing 700, to become a part of the housing 700. For example, the second heat exchanger 400 may be a part of the housing side surface 720.

When the heat dissipation apparatus includes the housing 700, the pipeline connector 233 is disposed on the housing 700, is located outside the housing 700, and is connected to the third liquid cooling pipe 231 disposed inside the housing 700. In this way, the first extension pipe 232 may be connected to the third liquid cooling pipe 231 through the pipeline connector 233 outside the housing 700. In addition, the pipeline connector 343 is disposed on the housing 700, is located outside the housing 700, and is connected to the fourth liquid cooling pipe 341 disposed inside the housing 700. In this way, the second extension pipe 342 may be connected to the fourth liquid cooling pipe 341 through the pipeline connector 343 outside the housing 700.

When the heat dissipation apparatus includes the housing 700, the first extension pipe 232, the second extension pipe 342, and the first heat exchanger 300 may be disposed outside the housing 700. In this way, the first heat exchanger 300 may be disposed away from the housing 700 at any place with a heat source. In other words, the heat source and the housing 700 may be disposed separately.

With reference to FIG. 3 to FIG. 14, when the heat dissipation apparatus provided in this embodiment of this application operates, the liquid coolant 110 forms a cycle in a sequence of the liquid storage tank 100→the first liquid cooling pipe 120→the liquid pump 200→the first extension pipeline 230→the first heat exchanger 300→the second extension pipeline 340→the second heat exchanger 400→the second liquid cooling pipe 410→the liquid storage tank 100 under pressure of the liquid pump 200. In the first heat exchanger 300, the first heat exchanger 300 absorbs heat generated by the heat source, a small part of the heat is transferred to air through the first heat exchanger 300, and a remaining part of the heat is transferred to the liquid coolant 110 flowing through the first heat exchanger 300, to increase a temperature of the liquid coolant 110. When the liquid coolant 110 whose temperature is increased flows through the second heat exchanger 400, heat carried by the liquid coolant 110 may be transferred to the second heat exchanger 400, so that the temperature of the liquid coolant 110 decreases, and the liquid coolant 110 flows back to the liquid storage tank 100 to continue to participate in the cycle. The heat in the second heat exchanger 400 is quickly volatilized into air under an action of the cooling air of the heat dissipation fan 500.

Figure 15:
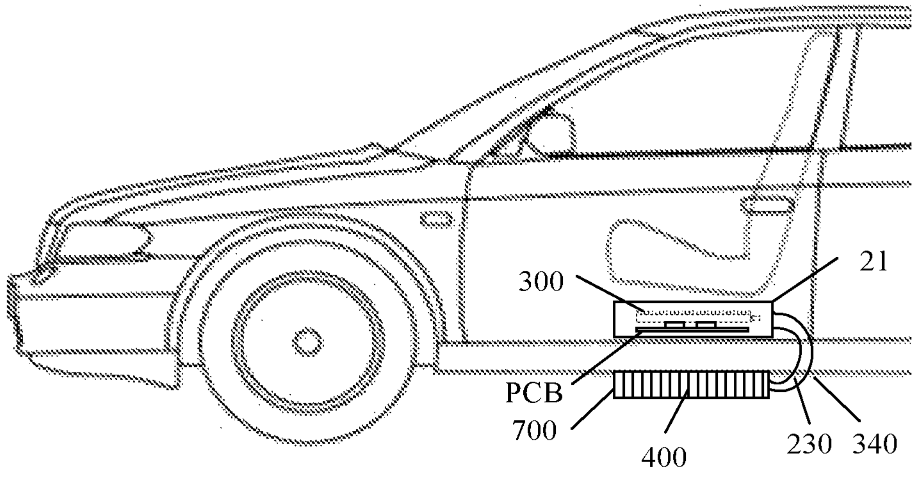
FIG. 15 is a schematic diagram in which a heat dissipation apparatus is installed in a vehicle according to an embodiment of this application.

The heat dissipation apparatus in this embodiment of this application may be configured to dissipate heat for the autonomous driving computing platform. FIG. 15 is a schematic diagram in which the heat dissipation apparatus is installed in a vehicle according to an embodiment of this application. As shown in FIG. 15, the autonomous driving computing platform is installed under a seat inside the vehicle, and includes at least one PCB. The first heat exchanger 300 of the heat dissipation apparatus is disposed on a side of the PCB that is of the autonomous driving computing platform and on which the heat emitting component such as a chip is provided, and is attached to the heat emitting component. The housing of the heat dissipation apparatus and other components inside the housing are disposed outside the vehicle, for example, disposed under a chassis of the vehicle. The other components inside the housing are connected to the first heat exchanger 300 through the first extension pipeline 230 and the second extension pipeline 340. In this way, when the heat dissipation apparatus operates, the first heat exchanger 300 absorbs heat generated by the autonomous driving computing platform, and transfers the heat to the liquid coolant flowing through the first heat exchanger 300. The liquid coolant flows out of the vehicle under pressure of the liquid pump, and transfers the heat carried by the liquid coolant to the second heat exchanger 400 located on the housing outside the vehicle. The heat in the second heat exchanger 400 is quickly released into air outside the vehicle under the action of the cooling air of the heat dissipation fan.

Therefore, according to the heat dissipation apparatus in this embodiment of this application, heat inside the vehicle generated by the autonomous driving computing platform is transferred and released to the outside of the vehicle. Compared with the conventional heat dissipation solution shown in FIG. 1, the heat dissipation apparatus in this embodiment of this application has the following technical effects.

1. Water-cooled heat dissipation and a distributed structure design are used to transfer some components of the heat dissipation apparatus to the outside of the vehicle. Only one heat exchanger needs to be installed on the autonomous driving computing platform inside the vehicle, and a component such as a fan lamp that occupies extra space inside the vehicle does not need to be installed. Therefore, the heat dissipation apparatus in this embodiment of this application meets a heat dissipation requirement of an autonomous driving computing platform of high-level autonomous driving, and reduces a module size of the autonomous driving computing platform, so that installation space of the autonomous driving computing platform is more easily found inside the vehicle, and design difficulty of a vehicle body structure is reduced.

2. The heat dissipation fan that can generate noise is disposed outside the vehicle, and a passenger inside the vehicle does not sense the noise of the heat dissipation fan. Therefore, the heat dissipation apparatus in this embodiment of this application does not affect an NVH indicator of the vehicle, and helps improve ride comfort of the passenger.

3. The heat inside the vehicle generated by the autonomous driving computing platform is transferred to the outside of the vehicle. Air outside the vehicle has better flow, heat dissipation is more favorable, and the heat is not aggregated. Therefore, the heat dissipation apparatus in this embodiment of this application has better heat dissipation performance.

4. The heat inside the vehicle generated by the autonomous driving computing platform is transferred to the outside of the vehicle, and the heat is not accumulated inside the vehicle, to reduce an overall in-vehicle temperature of and around the autonomous driving computing platform. In this way, the autonomous driving computing platform does not encounter a problem such as chip overheating frequency reduction, overheating self-protection triggering, or component overheating damage, so that system reliability is improved.

Figure 16:
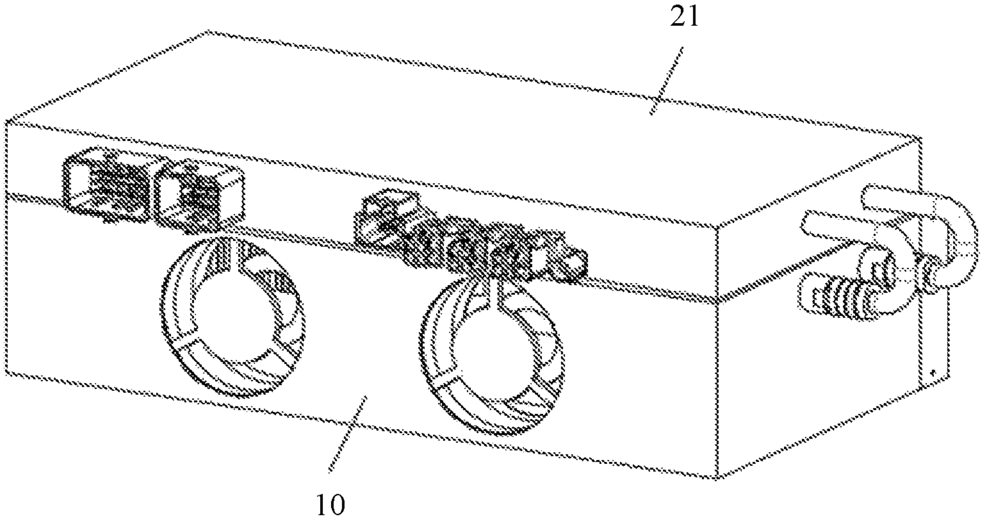
FIG. 16 is a schematic diagram of an integrated structure of a heat dissipation apparatus and an autonomous driving computing platform according to an embodiment of this application.

In some other embodiments, the heat dissipation apparatus and the autonomous driving computing platform may alternatively be designed into an integrated structure. As shown in FIG. 16, components of a heat dissipation apparatus 10 and a component such as a PCB of an autonomous driving computing platform 21 may be disposed in a same housing, or a housing of the heat dissipation apparatus 10 may be fastened to a housing of the autonomous driving computing platform 21. The integrated structure design of the heat dissipation apparatus 10 and the autonomous driving computing platform 21 may be applied to a vehicle that has a low requirement on an NVH indicator, for example, a truck or engineering machinery.

An embodiment of this application further provides a vehicle. The vehicle includes the heat dissipation apparatus provided in the foregoing embodiments of this application, to dissipate heat for any heat emitting component or module in the vehicle by using the heat dissipation apparatus, for example, an autonomous driving computing platform, an ECU, or a VCU. The vehicle includes but is not limited to a fossil fuel-powered motor vehicle, a fuel-electric hybrid motor vehicle, a pure electric motor vehicle, engineering machinery with a driving capability, an automated guided vehicle (AGV), or a robot with a driving capability.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A heat dissipation apparatus comprising:

a housing comprising a first housing surface and a second housing surface, wherein the second housing surface is disposed around the first housing surface and comprises a third housing surface and a fourth housing surface, wherein the third housing surface is opposite to the fourth housing surface;

a liquid storage tank configured to store a liquid coolant;

a first liquid cooling pipe;

a liquid pump externally coupled to the liquid storage tank through the first liquid cooling pipe, wherein the liquid pump is disposed on the first housing surface;

a first extension pipeline;

a first heat exchanger disposed away from the housing, coupled to the liquid pump through the first extension pipeline, configured to fasten to a printed circuit board, and is configured to:

be in contact with a heat source disposed on a surface of the printed circuit board;

absorb heat from the heat source; and transfer the heat to the liquid coolant flowing through the first heat exchanger;

a second extension pipeline;

a second liquid cooling pipe;

a second heat exchanger disposed inside the housing, forms either the third housing surface or a part of the third housing surface, coupled to the first heat exchanger through the second extension pipeline, and further coupled to the liquid storage tank through the second liquid cooling pipe, wherein the second heat exchanger is configured to:

absorb the heat from the liquid coolant flowing through the second heat exchanger; and release the heat into an environment external to the second heat exchanger, and wherein the liquid pump is configured to:

receive the liquid coolant from the liquid storage tank via the first liquid cooling pipe; and pressurize the liquid coolant to cause the liquid coolant to flow into the first heat exchanger, out of the first heat exchanger into the second heat exchanger, and out of the second heat exchanger into the liquid storage tank; and a heat dissipation fan facing the second heat exchanger and configured to generate cooling air from the environment for the second heat exchanger to accelerate a flow of the cooling air around the second heat exchanger, wherein the heat dissipation fan is disposed on the fourth housing surface.

2. The heat dissipation apparatus of claim 1, wherein the liquid storage tank, the liquid pump, the heat dissipation fan, and the second heat exchanger are disposed inside the housing, and wherein the first heat exchanger is disposed outside the housing and is independent of the housing.

3. The heat dissipation apparatus of claim 2, wherein the first heat exchanger comprises a heat exchange plate and a first thermally conductive pipe, wherein the first thermally conductive pipe is disposed inside the heat exchange plate and comprises:

a first end that is a first liquid inlet of the first heat exchanger; and a second end that is a first liquid outlet of the first heat exchanger, and wherein the first end and the second end are coupled to the heat exchange plate.

4. The heat dissipation apparatus of claim 3, wherein the heat exchange plate further comprises first plate surface of a planar structure, and wherein the first plate surface is configured to be in contact with the heat source.

5. The heat dissipation apparatus of claim 4, wherein the heat exchange plate further comprises a second plate surface located opposite to the first surface, and wherein the second plate surface comprises a plurality of heat sink fins disposed at intervals.

6. The heat dissipation apparatus of claim 3, wherein the second heat exchanger comprises:

a fin structure formed by stacking a plurality of metal sheets, comprising a gap between two adjacent metal sheets of the metal sheets; and a second thermally conductive pipeline configured to shuttle back and forth between the metal sheets and comprising:

a third end that is a second liquid inlet of the second heat exchanger; and a fourth end that is a second liquid outlet of the second heat exchanger, wherein the fin structure is configured to:

absorb the heat of the liquid coolant in the second thermally conductive pipeline; and release the heat into the environment.

7. The heat dissipation apparatus of claim 6, wherein the metal sheets are disposed in parallel with an air duct direction of the heat dissipation fan.

8. The heat dissipation apparatus of claim 6, wherein the second extension pipeline comprises:

a third liquid cooling pipe comprising:

a fifth end coupled to the second liquid inlet; and a sixth end comprising third quick connector; and an extension pipe comprising:

a seventh end coupled to the first liquid outlet; and an eighth end comprising a fourth quick connector, wherein the third liquid cooling pipe is coupled to the extension pipe through the third quick connector and the fourth quick connector.

9. The heat dissipation apparatus of claim 8, wherein the third quick connector is disposed on the housing and is located on an outer side of the second housing surface.

10. The heat dissipation apparatus of claim 3, wherein the first extension pipeline comprises:

a third liquid cooling pipe comprising:

a third end coupled to the liquid pump; and a fourth end coupled to a first quick connector; and an extension pipe comprising:

a fifth end coupled to the first liquid inlet; and a sixth end coupled to a second quick connector, wherein the third liquid cooling pipe is coupled to the extension pipe through the first quick connector and the second quick connector.

11. The heat dissipation apparatus of claim 10, wherein the first quick connector is disposed on the housing and is located on an outer side of the second housing surface.

12. The heat dissipation apparatus of claim 1, wherein the liquid storage tank, the liquid pump, and the heat dissipation fan are disposed inside the housing, wherein the first heat exchanger is disposed outside the housing and is independent of the housing, and wherein the second heat exchanger is a part of the housing.

13. The heat dissipation apparatus of claim 1, wherein the heat source comprises at least one heat-emitting component on the printed circuit board of an autonomous driving computing platform, and wherein the first heat exchanger is configured to be in contact with the heat source.

14. The heat dissipation apparatus of claim 1, wherein the liquid pump is configured to:

extract the liquid coolant from the liquid storage tank; and pressurize the liquid coolant to enable the liquid coolant to circulate in a closed loop sequentially through the liquid storage tank, the liquid pump, the first heat exchanger, and the second heat exchanger.

15. A vehicle comprising:

an autonomous driving computing platform comprising a printed circuit board, wherein the printed circuit board comprises a heat source that is coupled to the printed circuit board through a thermal interface material; and a heat dissipation apparatus comprising:

a housing comprising a first housing surface and a second housing surface, wherein the second housing surface is disposed around the first housing surface and comprises a third housing surface and a fourth housing surface, wherein the third housing surface is opposite to the fourth housing surface;

a liquid storage tank configured to store a liquid coolant;

a first liquid cooling pipe;

a liquid pump externally coupled to the liquid storage tank through the first liquid cooling pipe, wherein the liquid pump is disposed on the first housing surface;

a first extension pipeline;

a first heat exchanger disposed inside the vehicle, disposed away from the housing, coupled to the liquid pump through the first extension pipeline, fastened to the printed circuit board, and configured to:

be in contact with the thermal interface material on the heat source disposed on a surface of the printed circuit board;

absorb heat from the heat source; and transfer the heat to the liquid coolant flowing through the first heat exchanger;

a second extension pipeline;

a second liquid cooling pipe;

a second heat exchanger disposed inside the housing, forms either the third housing surface or a part of the third housing surface, coupled to the first heat exchanger through the second extension pipeline, further coupled to the liquid storage tank through the second liquid cooling pipe, disposed outside the vehicle, and configured to:

absorb the heat from the liquid coolant flowing through the second heat exchanger; and release the heat into an environment external to the vehicle, and wherein the liquid pump is configured to:

receive the liquid coolant from the liquid storage tank via the first liquid cooling pipe; and pressurize the liquid coolant to cause the liquid coolant to flow into the first heat exchanger, out of the first heat exchanger into the second heat exchanger, and out of the second heat exchanger into the liquid storage tank; and a heat dissipation fan disposed outside the vehicle, facing the second heat exchanger, disposed on the fourth housing surface, and configured to generate cooling air from the environment for the second heat exchanger to accelerate a flow of the cooling air around the second heat exchanger, wherein the liquid storage tank, the liquid pump, the second heat exchanger, and the heat dissipation fan are disposed outside the vehicle such that the heat generated by the heat source of the autonomous driving computing platform is transferred to the environment external to the vehicle.

16. The vehicle of claim 15, wherein the liquid storage tank, the liquid pump, the heat dissipation fan, and the second heat exchanger are disposed inside the housing, and wherein the first heat exchanger is disposed outside the housing and is independent of the housing.

17. The vehicle of claim 16, wherein the first heat exchanger comprises a heat exchange plate and a first thermally conductive pipe, wherein the first thermally conductive pipe is disposed inside the heat exchange plate and comprises:

a first end that is a first liquid inlet of the first heat exchanger; and a second end that is a first liquid outlet of the first heat exchanger, and wherein the first end and the second end are coupled to the heat exchange plate.

18. The vehicle of claim 17, wherein the heat exchange plate further comprises a first plate surface of a planar structure, and wherein the first plate surface is configured to be in contact with the thermal interface material on the heat source.

19. The vehicle of claim 18, wherein the heat exchange plate further comprises a second plate surface located opposite to the first plate surface, and wherein the second plate surface comprises a plurality of heat sink fins disposed at intervals.

20. The vehicle of claim 17, wherein the second heat exchanger comprises:

a fin structure formed by stacking a plurality of metal sheets, comprising a gap between two adjacent metal sheets of the metal sheets; and a second thermally conductive pipeline configured to shuttle back and forth between the metal sheets and comprising:

a third end that is a second liquid inlet of the second heat exchanger; and a fourth end that is a second liquid outlet of the second heat exchanger, wherein the fin structure is configured to:

absorb the heat of the liquid coolant in the second thermally conductive pipeline; and release the heat into the environment.

* * * * *